(12) United States Patent
Bittner et al.

(10) Patent No.: US 9,927,714 B2
(45) Date of Patent: Mar. 27, 2018

(54) PROJECTION EXPOSURE APPARATUS WITH AT LEAST ONE MANIPULATOR

(71) Applicant: Carl Zeiss SMT GmbH, Oberkochen (DE)

(72) Inventors: Boris Bittner, Roth (DE); Stefan Rist, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

(21) Appl. No.: 15/484,402

(22) Filed: Apr. 11, 2017

(65) Prior Publication Data

US 2017/0219932 A1    Aug. 3, 2017

Related U.S. Application Data

(63) Continuation of application No. PCT/EP2015/002277, filed on Nov. 13, 2015.

(30) Foreign Application Priority Data

Nov. 20, 2014 (DE) .................. 10 2014 223 750

(51) Int. Cl.
  *G03F 7/20* (2006.01)
(52) U.S. Cl.
  CPC .......... *G03F 7/70266* (2013.01); *G03F 7/705* (2013.01); *G03F 7/70233* (2013.01)
(58) Field of Classification Search
  CPC ............. G03F 7/70091; G03F 7/70258; G03F 7/7085; G03F 7/70233
  USPC .................................... 355/52, 53, 55, 67–71
  See application file for complete search history.

(56) References Cited

U.S. PATENT DOCUMENTS

| | | | |
|---|---|---|---|
| 9,170,497 B2 * | 10/2015 | Bittner | G03F 7/70258 |
| 2010/0020302 A1 | 1/2010 | Freimann | |
| 2010/0321661 A1 * | 12/2010 | Natt | G03F 7/70091 355/67 |
| 2011/0181855 A1 | 7/2011 | Bittner et al. | |
| 2013/0188246 A1 | 7/2013 | Rogalsky et al. | |
| 2013/0258302 A1 | 10/2013 | Bittner et al. | |
| 2014/0176924 A1 | 6/2014 | Bittner et al. | |
| 2014/0340664 A1 * | 11/2014 | Bleidistel | G03F 7/70141 355/67 |

FOREIGN PATENT DOCUMENTS

| | | |
|---|---|---|
| DE | 10 2012 205 096 B3 | 8/2013 |
| WO | WO 2008/089898 A1 | 7/2008 |
| WO | WO 2010/034674 A1 | 4/2010 |
| WO | WO 2014/139543 A1 | 9/2014 |

OTHER PUBLICATIONS

International Search Report and Written Opinion for corresponding PCT Appl No. PCT/EP2015/002277, dated Mar. 24, 2016.

(Continued)

*Primary Examiner* — Hung Henry Nguyen
(74) *Attorney, Agent, or Firm* — Fish & Richardson P.C.

(57) ABSTRACT

A microlithography projection exposure apparatus includes a projection lens at least one manipulator to change an optical effect of at least one optical element of the projection lens, and a travel establishing device for generating a travel command for the at least one manipulator.

20 Claims, 2 Drawing Sheets

(56) References Cited

OTHER PUBLICATIONS

H. Gross, "Handbook of Optical Systems", vol. 2, 2005, Wiley-VCH Verlag GmbH & Co. KGaA, Weinheim, Table 20-2, p. 215.
German Office Action, with translation thereof, for corresponding DE Appl No. 10 2014 223 750.5, dated Jul. 12, 2015.
Stephen Boyd and Lieven Vandenberghe, Textbook, "Convex Optimization", Cambridge University Press 2004, Chapter 5.5.3.
Michael Bartholomew-Biggs, "Nonlinear Optimization with Engineering Applications", Springer 2008, Chapter 7.
Daniel Malacara, Textbook "Optical Shop Testing"; 2nd Edition (1992), Chapter 13.2.3.

* cited by examiner

PROJECTION EXPOSURE APPARATUS WITH AT LEAST ONE MANIPULATOR

CROSS-REFERENCE TO RELATED APPLICATIONS

The present application is a continuation of, and claims benefit under 35 USC 120 to, international application PCT/EP2015/002277, filed Nov. 13, 2015, which claims benefit under 35 USC 119 of German Application No. 10 2014 223 750.5, filed Nov. 20, 2014. The entire disclosure of these applications are incorporated into the present application by reference.

FIELD

The disclosure relates to a projection exposure apparatus for microlithography, and to a method for controlling such a projection exposure apparatus. A projection exposure apparatus for microlithography serves for producing structures on a substrate in the form of a semiconductor wafer during the production of semiconductor components. For this purpose, the projection exposure apparatus includes a projection lens having a plurality of optical elements for imaging mask structures onto the wafer during an exposure process.

BACKGROUND

In order to ensure that the mask structures are imaged as precisely as possible onto the wafer, a projection lens having the lowest possible level of wavefront aberrations is desired. Projection lenses are therefore equipped with manipulators which make it possible to correct wavefront aberrations by changing the state of individual optical elements of the projection lens. Examples of such a state change include: a change in position in one or more of the six rigid body degrees of freedom of the relevant optical element, an application of heat and/or cold to the optical element, and a deformation of the optical element. Usually, for this purpose, the aberration characteristic of the projection lens is regularly measured and, if appropriate, changes in the aberration characteristic between the individual measurements are determined by simulation. In this regard, for example, lens element heating effects can be taken into account computationally. The terms "lens element warming", "mirror heating" and "mirror warming" are also used synonymously for "lens element heating". The manipulator changes to be carried out in order to correct the aberration characteristic are calculated via a travel generating optimization algorithm, which is also referred to as "manipulator change model". Such optimization algorithms are described for example in WO 2010/034674 A1.

"Travel" is understood to mean a change—effected via manipulator actuation—in a state variable of an optical element along the travel for the purpose of changing the optical effect thereof. Such travel defined by changing a state variable of the optical element is specified by setpoint change variables of the manipulator. By way of example, the manipulation can consist in a displacement of the optical element in a specific direction, but also, for example, in an, in particular local or areal, application of heat, cold, forces, light having a specific wavelength or currents to the optical element. By way of example, in the case of displacement, the setpoint change variable can define a path length to be covered or an angular range to be covered.

Known travel generating optimization algorithms are often unsuitable for active manipulator control during the exposure of a wafer owing to excessively long computation times when establishing a travel command. The computation times of travel generating optimization algorithms can be reduced via Tikhonov regularization, for example. However, that can lead to a loss of accuracy in the result of the optimization process.

SUMMARY

The disclosure seeks to provide a projection exposure apparatus and a method for controlling such a projection exposure apparatus with which the abovementioned problems are solved and, in particular, travel commands can be generated with an increased clock rate and at the same time a high accuracy.

In one aspect, the disclosure provides a projection exposure apparatus for microlithography including: a projection lens for imaging mask structures, at least one manipulator, which is configured to change an optical effect of at least one optical element of the projection lens by manipulating a property of the optical element along a travel, and a travel establishing device for generating a travel command for the at least one manipulator. In this case, the travel establishing device is configured firstly to generate a first travel command from a first state characterization of the projection lens by executing an optimization algorithm with at least one work variable. The optimization algorithm is configured to change a value of the work variable in the course of the optimization and to save the value of the work variable that is present at the end of the optimization as a transfer value. The travel establishing device is furthermore configured to generate a further travel command from a further state characterization of the projection lens, the further state characterization being updated relative to the first state characterization, by repeated execution of the optimization algorithm and in the process to use the saved transfer value as a start value of the at least one work variable, i.e. to use the saved transfer value as a start value of the at least one work variable when performing the repeated execution of the optimization algorithm.

The saving—according to the disclosure—of the value of the work variable that is present at the end of the optimization as a transfer value and the use of the saved transfer value as a start value of the at least one work variable for the repeated execution of the optimization algorithm in a subsequent optimization makes it possible to use "knowledge" from the previous optimization for the subsequent optimization. The time for the subsequent optimization can thus be considerably reduced since the work variable need no longer be completely recalculated. Rather, only an adaptation of the work variable, proceeding from the transferred values, is performed during the subsequent optimization. As a result, the travel commands can be generated with an increased clock rate in conjunction with a still high accuracy. The accuracy achievable for the optimization result is, in particular, not worse than the result of a corresponding optimization in which the work variable is determined completely anew.

The work variable can be a scalar variable or a vectorial variable. The value of the work variable is then correspondingly a scalar or a vector. The state characterization of the projection lens includes at least one state parameter. The state parameter characterizes the imaging quality of the projection lens. For the case in which the state characterization includes a plurality of state parameters, the latter can be described for example via a state vector b.

The travel command for the at least one manipulator includes in each case at least one travel for actuating the at least one manipulator. A manipulator actuation should be understood to mean the change of the optical effect of the at least one optical element within the projection lens by changing a property of the optical element along the pre-defined travel. For the case in which a plurality of manipulators $M_i$ are provided, the travel command preferably includes a respective travel $x_i$ for each of the manipulators. The travels $x_i$ assigned to the individual manipulators $M_i$ can then be described by a travel vector x.

In the description of the state characterization by a state vector b and the description of the travel command by a travel vector x, the optimization algorithm according to the disclosure can be configured for example for solving the following optimization problem:

$$\min \|Mx-b\|_2^2 \tag{1}$$

In this case, M denotes a sensitivity matrix of the manipulators. The matrix defines the sensitivities of the manipulators $M_i$ in relation to the degrees of freedom of movement thereof. Relative to a manipulator $M_i$, the sensitivity matrix M defines how the state vector b of the projection lens changes if the manipulator $M_i$ is adjusted by a standard travel $x_i^0$.

In accordance with formula (1), the optimization algorithm establishes the minimum of the merit function described by the square of the Euclidean norm $\| \|_2$ of Mx−b.

The state generator can include a simulation device that is configured to simulate changes in the optical properties of the at least one optical element which take place as a result of the heating of the optical element, and to determine the state characterization on the basis of the simulation result.

The work variable can also be referred to as "internal work variable", i.e. the value of the work variable is not output as optimization result by the optimization algorithm. The saving of the value of the work variable as a transfer value can be carried out by temporary buffer-storage of the value in a working memory of the travel establishing device or by storage in a permanent memory. The merit function can be predefined by the user, for example before the beginning of the exposure of specific mask structures. Alternatively, the travel establishing device can also have a merit function generator that generates the merit function on the basis of exposure parameters such as e.g. structure type of mask structures to be imaged and/or illumination setting.

In accordance with one embodiment, the optimization algorithm is configured to optimize a merit function taking account of at least one constraint described outside the merit function. Such a constraint can also be referred to as "explicit constraint". The latter thus differs from an implicit constraint that is described in the context of a merit function, as is the case for example for the merit function of a Tikhonov regularization as described under (a$^v$) on page 45 of WO 2010/034674 A1. In accordance with this embodiment, for example, the exemplary optimization problem described under formula (1) above can be supplemented as follows by constraints described outside the merit function:

$$NB: x_i \leq c_i^{NB}, \tag{2}$$

wherein i can have values between 1 and the number k of travels (k≥1), $x_i$ denotes the relevant travel, and $c_i^{NB}$ denotes a respective fixed limit value for the relevant travel $x_i$.

In accordance with a further embodiment, the projection exposure apparatus furthermore includes a state generator which is configured to provide the first state characterization and the second, updated state characterization of the projection lens during the operation of the projection exposure apparatus. In particular, the state generator is configured to provide the first and second state characterizations of the projection lens in an exposure pause occurring between exposure processes during the operation of the projection exposure apparatus, also during an exposure process. Generally, the state generator is configured to provide a state characterization of the projection lens and to update it multiply during the operation of the projection exposure apparatus, in particular in an exposure pause or an exposure process.

In accordance with a further embodiment, the at least one work variable includes a limit value for the travel of the at least one manipulator, the limit value being set at times during the optimization process. In this regard such a work variable can define a temporary constraint, i.e. a constraint which holds true only temporarily during the optimization process, for example as follows:

$$x_i \leq c_i^t \tag{3}$$

In this case, $c_i^t$ is a temporary limit value for the relevant travel $x_i$. If the work variable is designated by $a_n$ (wherein n can have values between 1 and the number of work variables 1), then $a_n = c_i^t$.

In accordance with a further embodiment, the optimization algorithm is configured to optimize a merit function taking account of at least one constraint, wherein the constraint specifies a limit value for a parameter, and the at least one work variable includes information as to whether the relevant parameter deviates from the limit value by a maximum of 10%, in particular by a maximum of 5% or by a maximum of 1% at the respective point in time. In other words, the work variable indicates whether the parameter has reached the value of the limit value or deviates by a maximum of 10% from the limit value. In this regard, in accordance with this embodiment, a corresponding value can be allocated to a work variable an for example as follows:

$$\text{If } |x_i(t)-c_i^{NB}| \leq 0.1 \cdot c_i^{NB}, \text{ then } a_n=1, \text{ otherwise } a_n=0 \tag{4}$$

In particular, a plurality of work variables are provided which form a list having information concerning each constraint or a subset of all constraints which indicates whether the relevant parameter of each constraint deviates by a maximum of 10% from the corresponding limit value at the respective point in time.

In accordance with a further embodiment, the at least one work variable includes at least one Lagrange variable of the Karush-Kuhn-Tucker condition. The person skilled in the art knows the Karush-Kuhn-Tucker condition for example from chapter 5.5.3 of the textbook by Stephen Boyd and Lieven Vandenberghe "Convex Optimization", Cambridge University Press 2004.

In accordance with a further embodiment, the at least one work variable includes a change direction of an optimization variable that is chosen by the optimization algorithm at the given point in time. Such a work variable is preferably a vector variable (an) that specifies the change direction of the optimization variable. The optimization variable is generally the merit function. In the case in which the optimization algorithm is configured for solving a minimization problem, the work variable preferably specifies a descending direction of the optimization variable. The merit function of such an optimization problem defines a value depending on one or a plurality of work variables given by the travels $x_i$ in accordance with the previous examples. If the value of the merit function is represented graphically for example depending on two travels $x_i$, then a "mountain range" results, the minimum of which is to be found by the optimization algorithm. During the execution of the optimization algorithm, the vector of the work variable x is moved step by step on the "mountain range". The direction in which this movement takes place at a specific point in time during the execution of the optimization algorithm is stored in the corresponding work variable. In other words, the work variable in the case of a minimization problem preferably specifies the direction of the steepest mountain descent on the "mountain range" at the given point in time. The steepest descent method employed here is known by the person skilled in the art for example from chapter 7 of the textbook by Michael Bartholomew-Biggs, "Nonlinear Optimization with Engineering Applications", Springer 2008.

In accordance with a further embodiment, the optimization algorithm is configured to change the value of the work variable iteratively in the course of the optimization.

In accordance with a further embodiment, the optimization algorithm is configured to establish the further travel command in a time period of less than one second, in particular in less than 100 milliseconds or less than 50 milliseconds or less than 20 milliseconds. The updating rate of the state characterization is correspondingly adapted to the clock rate of the optimization algorithm.

In accordance with a further embodiment, the state characterizations in each case include a set of aberration parameters characterizing the imaging quality of the projection lens, wherein the state characterization is updated so frequently that a plurality of selected aberration parameters of the further state characterization deviate from the corresponding aberration parameter of the first state characterization in each case by less than 10%, in particular by less than 5% or by less than 1%. The aberration parameters are Zernike coefficients, in particular.

In accordance with one embodiment variant, the selected aberration parameters include at least two Zernike coefficients from a group of Zernike coefficients Zn where n≤100, the assigned Zernike polynomials of which are odd-wave Zernike polynomials, in particular where n≤81, n≤64, n≤49, n≤36 or n≤25. Here the aberration parameters can be defined by in each case individual Zernike coefficients from among the Zernike coefficients or else in each case by a linear combination of a selection from the described group of Zernike coefficients Zn. In accordance with one exemplary embodiment, the selection of Zernike coefficients Zn includes Z2, Z3, Z7, Z8, Z10, Z11. In accordance with a further exemplary embodiment, the selected aberration parameters furthermore include the Zernike coefficient Z4. In accordance with a further exemplary embodiment, the selected aberration parameters include the Zernike coefficients Z2, Z3 and Z4. In accordance with a further exemplary embodiment, the selected aberration parameters include all Zernike coefficients Zn where 25≤n≤100. The Zernike coefficients are designated in accordance with so-called fringe sorting, as explained in greater detail below in the description of the figures.

In accordance with a further embodiment, the travel establishing device is configured to generate a multiplicity of further travel commands by repeated execution of the optimization algorithm during the exposure process and to use in each case the transfer value stored during the generation of the preceding travel command here as a respective start value of the at least one work variable. In accordance with one embodiment variant, the multiplicity of further travel commands to be generated during the exposure process includes at least fifty travel commands. In particular, the multiplicity of further travel commands to be generated during the exposure process includes at least 200 or at least 1000 travel commands.

In accordance with a further embodiment, the at least one constraint described outside the merit function includes a fixed boundary for the travel performed by the at least one manipulator. Such a constraint is already described in formula (2) above. Alternatively, the constraint can define a variable that is generated via a linear model from the travels of a plurality of manipulators. Such a constraint can be formulated as follows:

$$NB: b_1 x_1 + b_2 x_2 + \ldots + b_n x_n \leq c_b^{NB}, \quad (5)$$

wherein $b_1$ to $b_n$ are the weighting factors of the individual travels $x_i$ to $x_n$. In a case in which the travel defines a local change in temperature of a heatable plate operated in transmission or of a heatable mirror, the fixed boundary is a maximum value of the local change in temperature.

In a case in which the travel defines a heating power at a heatable plate operating in transmission or at a heatable mirror, the fixed boundary is a maximum value of the heating power.

In a case in which the travel defines a local stress at a lens element material or a mirror substrate of an optical element of the projection lens that is embodied as a deformable lens element or deformable mirror, the fixed boundary is a maximum value of the local stress.

In a case in which the travel defines a force of an optical element of the projection lens that is embodied as a deformable lens element or as a deformable mirror, the force being applied to a lens element material or a mirror substrate, the fixed boundary is a maximum value of the force.

In a case in which the travel defines a moment of an optical element of the projection lens that is embodied as a deformable lens element or as deformable mirror, the moment being applied to a lens element material or a mirror substrate, the fixed boundary is a maximum value of the local stress. A typical magnitude of the local stress is between 5 and 100 megapascals.

In accordance with a further embodiment, the state generator is configured to update the state characterization of the projection lens multiply during an exposure process in which the mask structures of a reticle are imaged onto a substrate once via the projection lens. An exposure process extends in particular over the time period for the single imaging of the mask structures of a reticle onto a substrate, in other words the time period for exposing a field.

In one aspect, the disclosure provides a method for controlling a projection exposure apparatus for microlithography including a projection lens for imaging mask structures, the projection lens including a plurality of optical elements. The method includes generating a first travel command from a first state characterization of the projection lens by executing an optimization, wherein in the course of the optimization a value of at least one work variable is changed and the value of the work variable that is present at the end of the optimization is saved as a transfer value, and changing an optical effect of at least one of the optical elements by manipulating a property of the optical element along a travel defined by the first travel command. Furthermore, the method includes generating a further travel command from a further state characterization of the projection lens, the further state characterization being updated relative to the first state characterization, by repeated execution of the optimization, wherein the saved transfer value is used as a start value of the at least one work variable.

In accordance with one embodiment of the method, the respective optimization is carried out by optimization of a merit function taking account of at least one constraint described outside the merit function.

In accordance with a further embodiment of the method, the at least one work variable includes a limit value for the travel, the limit value being set at times during the optimization process.

The features specified in respect of the abovementioned embodiments, exemplary embodiments and embodiment variants, etc., of the projection exposure apparatus according to the disclosure can be correspondingly applied to the method according to the disclosure, and vice versa. These and other features of the embodiments according to the disclosure are explained in the description of the figures and the claims. The individual features can be realized either separately or in combination as embodiments of the disclosure. Furthermore, they can describe advantageous embodiments which are independently protectable and protection for which is claimed if appropriate only during or after pendency of the application.

BRIEF DESCRIPTION OF THE DRAWINGS

The above and further advantageous features of the disclosure are illustrated in the following detailed description of exemplary embodiments according to the disclosure with reference to the accompanying schematic drawings, in which.

DETAILED DESCRIPTION OF EXEMPLARY EMBODIMENTS

In the exemplary embodiments or embodiments or embodiment variants described below, elements which are functionally or structurally similar to one another are provided with the same or similar reference signs as far as possible. Therefore, for understanding the features of the individual elements of a specific exemplary embodiment, reference should be made to the description of other exemplary embodiments or the general description of the disclosure.

Figure 1:
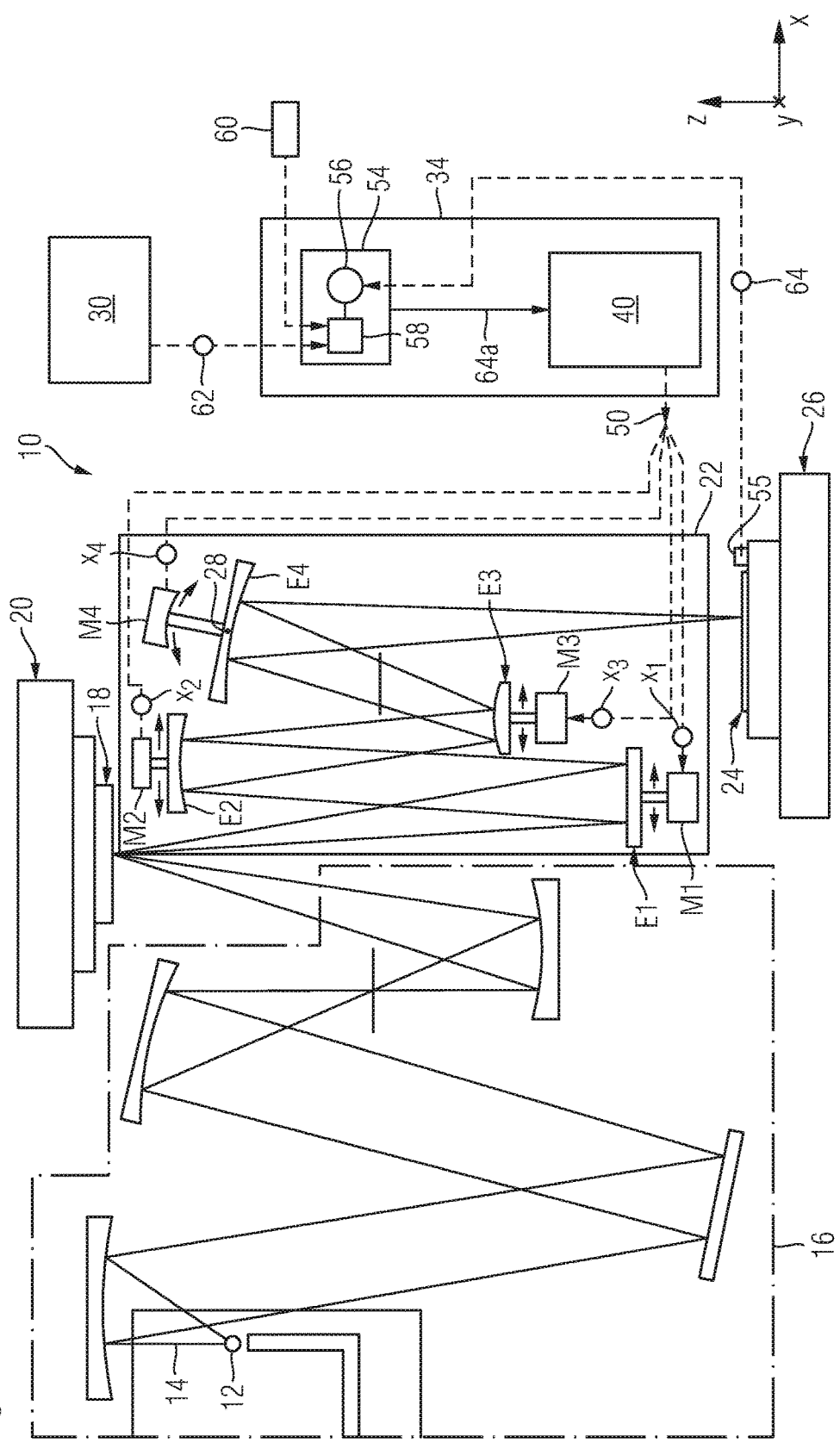
FIG. 1 shows an illustration of one embodiment according to the disclosure of a projection exposure apparatus for microlithography including a travel establishing device for generating a travel command.

To facilitate the description, a Cartesian xyz-coordinate system is indicated in the drawing, which system reveals the respective positional relationship of the components illustrated in the figures. In FIG. 1, the y-direction runs perpendicularly to the plane of the drawing into the latter, the x-direction runs towards the right and the z-direction runs upwards.

FIG. 1 shows an embodiment according to the disclosure of a projection exposure apparatus 10 for microlithography. The present embodiment is designed for operation in the EUV wavelength range, i.e. with electromagnetic radiation having a wavelength of less than 100 nm, in particular a wavelength of approximately 13.5 nm or approximately 6.7 nm. On account of this operating wavelength, all the optical elements are embodied as mirrors. However, the disclosure is not restricted to projection exposure apparatuses in the EUV wavelength range. Further embodiments according to the disclosure are designed for example for operating wavelengths in the UV range, such as, for example, 365 nm, 248 nm or 193 nm. In this case, at least some of the optical elements are configured as conventional transmission lens elements.

The projection exposure apparatus 10 in accordance with FIG. 1 includes an exposure radiation source 12 for generating exposure radiation 14. In the present case, the exposure radiation source 12 is embodied as an EUV source and can include a plasma radiation source, for example. The exposure radiation 14 firstly passes through an illumination optical unit 16 and is directed onto a mask 18 by the latter. The illumination optical unit 16 is configured to generate different angular distributions of the exposure radiation 14 incident on the mask 18. Depending on an illumination setting desired by the user, the illumination optical unit 16 configures the angular distribution of the exposure radiation 14 incident on the mask 18. Examples of selectable illumination settings include a so-called dipole illumination, annular illumination and quadrupole illumination.

The mask 18 has mask structures for imaging onto a substrate 24 in the form of a wafer and is mounted displaceably on a mask displacement stage 20. The mask 18 can be embodied as a reflection mask, as illustrated in FIG. 1, or alternatively, in particular for UV lithography, can also be configured as a transmission mask. In the embodiment in accordance with FIG. 1, the exposure radiation 14 is reflected at the mask 18 and thereupon passes through a projection lens 22, which is configured to image the mask structures onto the substrate 24. The exposure radiation 14 is guided within the projection lens 22 via a multiplicity of optical elements, in the form of mirrors in the present case. The substrate 24 is mounted displaceably on a substrate displacement stage 26. The projection exposure apparatus 10 can be embodied as a so-called scanner or as a so-called stepper.

In the embodiment in accordance with FIG. 1, the projection lens 22 has only four optical elements E1 to E4. All the optical elements are mounted in a movable fashion. For this purpose, a respective manipulator M1 to M4 is assigned to each of the optical elements E1 to E4. The manipulators M1, M2 and M3 respectively enable a displacement of the assigned optical elements E1, E2 and E3 in the x- and y-direction and thus substantially parallel to the plane in which the respective reflective surface of the optical elements is situated.

The manipulator M4 is configured to tilt the optical element E4 by rotation about a tilting axis 28 arranged parallel to the y-axis. The angle of the reflective surface of E4 is thus changed relative to the incident radiation. Further degrees of freedom for the manipulators are conceivable. In this regard, for example, a displacement of a relevant optical element transversely with respect to the optical surface thereof or a rotation about a reference axis perpendicular to the reflective surface can be provided.

In general terms, each of the manipulators M1 to M4 illustrated here is provided for bringing about a displacement of the assigned optical element E1 to E4 with implementation of a rigid body movement along a predefined travel. Such a travel can combine for example translations in different directions, tilting and/or rotations in an arbitrary manner. Alternatively or additionally, provision can also be made of manipulators which are configured to perform a different type of change in a state variable of the assigned optical element by corresponding actuation of the manipulator. In this regard, an actuation can be effected for example by a specific temperature distribution or a specific force distribution being applied to the optical element. In this case, the travel can be the result of a change in the temperature distribution at the optical element or the application of a local stress at an optical element embodied as a deformable lens element or as a deformable mirror.

The projection exposure apparatus 10 furthermore includes a central control device 30 for controlling the exposure process, including the mask displacement stage 20 and the substrate displacement stage 26. The projection exposure apparatus 10 furthermore includes a manipulator controller 34 for controlling the manipulators M1 to M4. The manipulator controller 34 in turn includes a state generator 54 and a travel establishing device 40. The state generator 54 transfers current state characterizations 64a of the projection lens 22 to the travel establishing device 40, which generates a travel command 50 therefrom. The travel command 50 includes travels $x_i$, in the case shown the travels $x_1$, $x_2$, $x_3$ and $x_4$. These travels serve for controlling the manipulators M1 to M4, as described in greater detail below.

As already mentioned, the travel command 50 generated by the travel establishing device 40 includes changes to be carried out by the manipulators M1 to M4 in the form of travels $x_i$ of corresponding state variables of the optical elements E1 to E4. The established travels $x_i$ are communicated to the individual manipulators M1 to M4 via travel signals and predefine for them respective correction travels to be carried out. These define corresponding displacements of the assigned optical elements E1 to E4 for correcting wavefront aberrations of the projection lens 22 that have occurred. In order to establish the travels $x_i$, the travel establishing device 40 receives from the state generator 54, in particular during the performance of the exposure process, respectively updated state characterizations 64a in the form of aberration parameters of the projection lens 22. These aberration parameters can include Zernike coefficients characterizing the wavefront, for example.

In accordance with one embodiment, the travel establishing device 40 generates updated travels $x_i$ in time periods of less than one second. By way of example, the travels $x_i$ can be updated in time periods of less than 200 milliseconds and thus in real time. An updating of the travels that is carried out in less than one second makes it possible, for example, to readjust the manipulators after each field exposure.

As already mentioned above, the regularly updated state characterization 64a of the projection lens 22 is communicated to the travel establishing device 40 by the state generator 54. In accordance with one embodiment, the respective state characterization 64a includes a set of aberration parameters that characterize the imaging quality of the projection lens 22. The aberration parameters can be present in the form of Zernike coefficients. The state characterization 64a is updated by the state generator 64 so frequently that a plurality of selected aberration parameters of the updated state characterization 64a deviate from the corresponding aberration parameter of the preceding state characterization 64a in each case by less than 10%.

In accordance with one embodiment, the selected aberration parameters that deviate by less than 10% can include at least two Zernike coefficients from a group of Zernike coefficients Zn, where n≤100, the assigned Zernike polynomials of which are odd-wave Zernike polynomials. Here the aberration parameters can be defined by in each case individual Zernike coefficients from among the Zernike coefficients or else in each case by a linear combination of a selection from the described group of Zernike coefficients Zn.

In the present application, as described for example in paragraphs [0125] to [0129] of US 2013/0188246A1, the Zernike functions $Z_m^n$ known from e.g. chapter 13.2.3 of the textbook "Optical Shop Testing", 2nd Edition (1992) by Daniel Malacara, publisher John Wiley & Sons, Inc., are designated by $Z_j$ in accordance with so-called fringe sorting, in which case $c_j$ are the Zernike coefficients assigned to the respective Zernike polynomials (also referred to as "Zernike functions"). Fringe sorting is illustrated for example in Table 20-2 on page 215 of "Handbook of Optical Systems", Vol. 2 by H. Gross, 2005 Wiley-VCH Verlag GmbH & Co. KGaA, Weinheim. A wavefront aberration $W(\Box,\Phi))$ at a point in the image plane of the projection lens is expanded depending on the polar coordinates $(\Box,\Phi)$ in the pupil plane as follows:

$$W(\rho, \Phi) = \sum_j c_j \cdot Z_j(\rho, \Phi) \qquad (6)$$

While the Zernike polynomials are designated by $Z_j$, i.e. with a subscripted index j, in the context of this application the Zernike coefficients $c_j$, as customary among those skilled in the art, are designated by Zj, i.e. with a normally positioned index, such as Z5 and Z6 for astigmatism, for example.

In accordance with one embodiment, the state generator 54 has a memory 56 and a simulation device 58. State characterizations 64 in the form of aberration parameters that were established via a wavefront measurement at the projection lens 22 are stored in the memory 56. These measurement results can be collected via an external wavefront measuring instrument. Alternatively, however, the state characterizations 64 can also be measured by a wavefront measuring device 55 integrated in the substrate displacement stage 26. For instance, such a measurement can be carried out regularly after each exposure of a wafer or respectively after the exposure of a complete wafer set. Alternatively, a simulation or a combination of simulation and reduced measurement can also be performed instead of a measurement.

The measured values of the state characterization 64 in the form of aberration parameters, the measured values being stored in the memory 56, are adapted, if appropriate, by the simulation device 58 to respective updated conditions during the exposure process. In accordance with one embodiment variant, for this purpose, the current irradiation intensity 62 is regularly communicated to the simulation device 58 by the central control device 30. The simulation device 58 calculates therefrom changes in the aberration parameters brought about on account of lens element heating on the basis of the respective illumination setting. Furthermore, the simulation device continuously receives measured values from a pressure sensor 60 that monitors the ambient pressure of the projection exposure apparatus 10. Effects of changes in the ambient pressure on the aberration parameters are taken into account by the simulation device 58.

Figure 2:
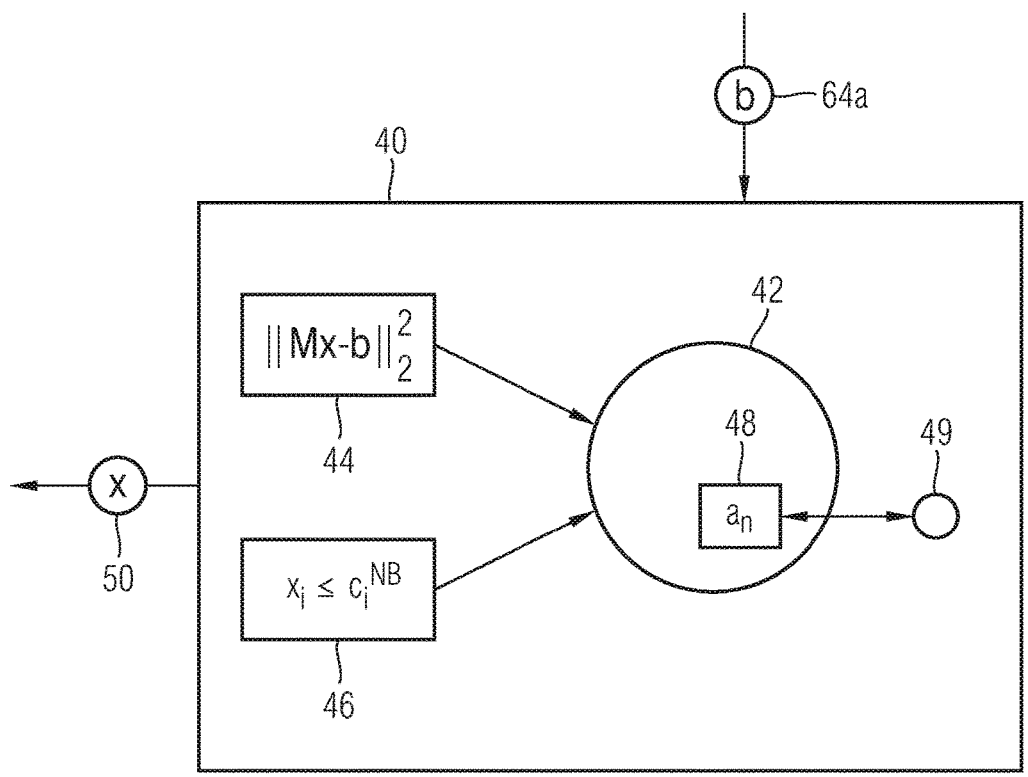
FIG. 2 shows an illustration of the construction and the functioning of the travel establishing device in accordance with FIG. 1.

The construction or the functioning of the travel establishing device 40 is illustrated in FIG. 2. The travel establishing device is configured for executing an optimization algorithm 42. The optimization algorithm 42 serves for optimizing a merit function 44 taking account of at least one constraint 46 described outside the merit function 44, which constraint can also be referred to as external constraint. In general, a plurality of external constraints are taken into account in the optimization.

The travels of the travel command 50 to be generated by the optimization algorithm 42 are described below by a travel vector x, the vector components of which are the individual travels $x_i$ mentioned above. The current state characterization 64a is described by a state vector b. In accordance with one embodiment variant, the sensitivities of the manipulators $M_i$, in the present case the manipulators M1 to M4, with regard to the degrees of freedom thereof in the case of a state change are described via a sensitivity matrix M. In this case, the sensitivity matrix M describes the relationship between an adjustment of the manipulator $M_i$ by a standard travel $x_i^0$ and a resultant change in the state vector b of the projection lens 22.

In accordance with one embodiment, the optimization algorithm 42 according to the disclosure is configured for solving the following optimization problem:

$$\min \|Mx-b\|_2^2$$

$$NB: x_i \leq c_i^{NB} \quad (7)$$

The optimization problem in accordance with (7) is configured to minimize the merit function 44 described by $\|Mx-b\|_2^2$ taking account of at least one constraint 46 described by $x_i \leq c_i^{NB}$. In this case, $\|\ \|_2$ denotes the Euclidean norm and $c_i^{NB}$ denotes a respective fixed limit value for the relevant travel $x_i$. More detailed information concerning the basic solution to such a merit function can be gathered e.g. from WO 2010/034674 A1, in particular pages 38 to 45.

The optimization problem represented under (7) is characterized in that the constraint 46 is described outside the merit function 44. Such a constraint can also be referred to as "explicit constraint". The latter therefore differs from an implicit constraint described in the context of a merit function, such as, for example, in the case of the merit function of a Tikhonov regularization as described under (a$^v$) on page 45 of WO 2010/034674 A1.

As an alternative or in addition to the constraint contained in (7) the constraint 46 can define a variable that is generated from the travels of a plurality of manipulators via a linear model. Such a constraint can be formulated as follows:

$$NB: g_1 x_1 + g_2 x_2 + \ldots + g_n x_n \leq c_g^{NB}, \quad (8)$$

wherein $g_1$ to $g_n$ are the weighting factors of the individual travels $x_i$ to $x_n$.

As is furthermore illustrated in FIG. 2, the optimization algorithm 42 is configured, in the course of an optimization, also referred to as optimization process, i.e. during the execution of the optimization algorithm for determining a travel command x, from a specific state characterization, iteratively to change one or a plurality of work variables 48 designated by an and to store the value of the work variables 48 that is present at the end of the optimization as a transfer value in a transfer memory 49. The transfer memory 49 is part of the travel establishing device 40 and can be for example a working memory or a permanent memory. The parameter n of the work variables an denotes a sequential number of the work variables and can have values of between 1 and the total number of work variables 1.

Such a work variable an can include a limit value for the travel of the at least one manipulator, the limit value being set at times during the optimization process. In this regard, one or a plurality of such work variables can define one or a plurality of temporary constraints, i.e. constraints which hold true only temporarily during the optimization process, for example as follows:

$$x_i \leq c_i^t \quad (9)$$

Here the work variables $a_n$ are defined by $c_i^t$, thereby specifying in each case a temporary limit value for the relevant travel $x_i$.

In accordance with one embodiment variant, the work variables an can additionally or alternatively include information as to whether the relevant parameter $x_i$ deviates from the limit value $c_i^{NB}$, defined by the constraint 46 in accordance with (7), by a maximum of 10% at the corresponding point in time. In other words, the corresponding work variable an specifies whether the parameter has reached the value of the limit value or deviates from the limit value by a maximum of 10%. The work variable an is then allocated the value 1 or 0 as follows:

If $|x_i(t)-c_i^{NB}| \leq 0.1 \cdot c_i^{NB}$, then $a_n=1$, otherwise $a_n=0$ (10)

In accordance with a further embodiment variant, the work variables an can additionally or alternatively include at least one Lagrange variable of the Karush-Kuhn-Tucker condition.

Furthermore, the work variables an can additionally or alternatively include a change direction of an optimization variable that is chosen by the optimization algorithm at the given point in time. Such a work variable an is preferably a vector variable an that specifies the change direction of the optimization variable. In the optimization problem specified under (7), the optimization variable is the merit function $\|Mx-b\|_2^2$ which is minimized. A work variable an specifying the change direction specifies a descending direction of the merit function. If the value of the merit function is represented graphically for example depending on two travels $x_i$, then a "mountain range" results, the minimum of which is to be found by the optimization algorithm. During the execution of the optimization algorithm, the vector of the work variable x is moved step by step on the "mountain range". The direction in which this movement takes place at a specific point in time during the execution of the optimization algorithm is stored in the corresponding work variable $a_n$. In other words, the corresponding work variable $a_n$ in the case of a minimization problem preferably specifies the direction of the steepest mountain descent on the "mountain range" at the given point in time.

As already mentioned above, the value of the one or the plurality of work variables 48 that is present at the end of an optimization process is stored as a transfer value in the transfer memory 49. Next, an updated value of the state characterization 64a is then read in and a further optimization is carried out on the basis of the updated state characterization 64a. In this case, the optimization algorithm 42 uses the value or values for the work variables 48 stored in the transfer memory 49.

In other words, in the optimization process then carried out, the work variables 48 are not reset to a standard value again, but rather taken over from the preceding optimization process. Thus, the optimization then carried out uses "knowledge" from the preceding optimization process, as a result of which the time period for carrying out the optimization can be significantly reduced. In other words, a higher clock rate when providing travel commands 50 without losses of accuracy becomes possible via the transfer of the values of the work variables 48.

The clock rate is preferably chosen with a magnitude such that the optimization result changes from optimization process to optimization process only to such a small extent that the transferred values of the work variables also have validity sufficient for the respective subsequent optimization process. The work variables have sufficient validity if the values of the work variables that are present at the end of the subsequent optimization process differ only slightly from the transferred values.

The above description of exemplary embodiments should be understood to be by way of example. The disclosure effected thereby firstly enables the person skilled in the art to understand the present disclosure and the advantages associated therewith, and secondly encompasses alterations and modifications of the described structures and methods that are also obvious in the understanding of the person skilled in the art. Therefore, all such alterations and modifications, in so far as they fall within the scope of the disclosure in accordance with the definition in the accompanying claims, and equivalents are intended to be covered by the protection of the claims.

LIST OF REFERENCE SIGNS 10 projection exposure apparatus
12 exposure radiation source
14 exposure radiation
16 illumination system
18 mask
20 mask displacement stage
22 projection lens
24 substrate
26 substrate displacement stage
28 tilting axis
30 central control device
34 manipulator controller
40 travel establishing device
42 optimization algorithm
44 merit function
46 constraint
48 work variable
49 transfer memory
50 travel command
54 state generator
55 wavefront measuring device
56 memory
58 simulation device
60 pressure sensor
62 current irradiation intensity
64 state characterization
64a current state characterization
$x_i$ to $x_4$ travels
E1 to E4 optical elements
M1 to M4 manipulators

What is claimed is:

1. An apparatus, comprising:
a projection lens configured to image mask structures, the projection lens comprising an optical element;
a manipulator configured to change an optical effect of the optical element by manipulating a property of the optical element along a travel; and
a device configured to generate a travel command for the manipulator,
wherein:
the device is configured to generate a first travel command from a first state characterization of the projection lens by executing an optimization algorithm comprising a work variable;
the optimization algorithm is configured to change a value of the work variable in the course of the optimization and to save the value of the work variable that is present at the end of the optimization as a transfer value;
the device is configured to generate a second travel command from a second state characterization of the projection lens by repeated execution of the optimization algorithm and in the process to use the saved transfer value as a start value of the work variable;
the second state characterization is updated relative to the first state characterization, and
the apparatus a microlithography projection exposure apparatus.

2. The apparatus of claim 1, wherein the optimization algorithm is configured to optimize a merit function taking account of a constraint described outside the merit function.

3. The apparatus of claim 2, wherein the constraint described outside the merit function comprises a fixed boundary for the travel performed by the at least one manipulator.

4. The apparatus of claim 1, further comprising a state generator configured to provide the first and second state characterizations of the projection lens.

5. The apparatus of claim 1, wherein the work variable comprises a limit value for the travel of the manipulator, and the limit value is set at times during the optimization process.

6. The apparatus of claim 1, wherein:
the optimization algorithm is configured to optimize a merit function taking account of a constraint;
the constraint specifies a limit value for a parameter; and
the work variable includes information as to whether the relevant parameter deviates from the limit value by a maximum of 10% at a given point in time.

7. The apparatus of claim 1, wherein the work variable comprises a Lagrange variable of the Karush-Kuhn-Tucker condition.

8. The apparatus of claim 1, wherein the work variable comprises a change direction of an optimization variable that is chosen by the optimization algorithm at the given point in time.

9. The apparatus of claim 1, wherein the optimization algorithm is configured to change the value of the work variable iteratively in the course of the optimization.

10. The apparatus of claim 1, wherein the optimization algorithm is configured to establish the second travel command in less than one second.

11. The apparatus of claim 1, wherein:
the state characterizations in each case comprise a set of aberration parameters characterizing the imaging quality of the projection lens; and
the state characterization is updated so frequently that a plurality of selected aberration parameters of the second state characterization deviate from the corresponding aberration parameter of the first state characterization in each case by less than 10%.

12. The apparatus of claim 11, wherein the selected aberration parameters comprise at least two Zernike coefficients from a group of Zernike coefficients $Z_n$ where $n \leq 100$, and the assigned Zernike polynomials are odd-wave Zernike polynomials.

13. The apparatus of claim 1, wherein the device is configured to generate a multiplicity of further travel commands by repeated execution of the optimization algorithm during the exposure process and to use in each case the transfer value stored during the generation of the preceding travel command as a respective start value of the work variable.

14. The apparatus of claim 13, wherein the multiplicity of further travel commands to be generated during the exposure process comprises at least fifty travel commands.

15. The apparatus of claim 1, wherein the state generator is configured to update the state characterization of the projection lens multiply during an exposure process in which the mask structures of a reticle are imaged onto a substrate once by means of the projection lens.

16. A method, comprising:
using the apparatus of claim 1 to image mask structures.

17. A method of controlling a microlithography projection exposure apparatus comprising an optical element, the method comprising:
generating a first travel command from a first state characterization of the projection lens by executing an optimization, wherein in the course of the optimization a value of a work variable is changed and the value of the work variable that is present at the end of the optimization is saved as a transfer value;
changing an optical effect of at least one of the optical elements by manipulating a property of the optical element along a travel defined by the first travel command; and
generating a second travel command from a further second characterization of the projection lens, the second state characterization being updated relative to the first state characterization by repeated execution of the optimization,
wherein the saved transfer value is used as a start value of the work variable.

18. The method of claim 17, wherein the optimization is carried out by optimization of a merit function taking account of a constraint described outside the merit function.

19. The method of claim 17, wherein the work variable comprises a limit value for the travel, and the limit value is set at times during the optimization process.

20. The method of claim 17, further comprising using the apparatus to image mask structures.

* * * * *

UNITED STATES PATENT AND TRADEMARK OFFICE
CERTIFICATE OF CORRECTION

PATENT NO.         : 9,927,714 B2
APPLICATION NO.    : 15/484402
DATED              : March 27, 2018
INVENTOR(S)        : Boris Bittner and Stefan Rist It is certified that error appears in the above-identified patent and that said Letters Patent is hereby corrected as shown below:

Column 2, Line 62: Delete "vectorial" and insert -- vector --, therefor.

Column 4, Line 39: Delete "an" and insert -- $a_n$ --, therefor.

Column 4, Line 60: Delete "(an)" and insert -- $(a_n)$ --, therefor.

Column 6, Line 18 (approx.): Delete "$x_i$" and insert -- $x_1$ --, therefor.

Column 9, Line 20: Delete "$x_i$," and insert -- $x_1$, --, therefor.

Column 10, Line 15: Delete "))" and insert -- ) --, therefor.

Column 10, Line 28: Delete "Zj," and insert -- $Z_j$, --, therefor.

Column 11, Line 48: Delete "$x_i$," and insert -- $x_1$, --, therefor.

Column 11, Line 55: Delete "an" and insert -- $a_n$ --, therefor.

Column 11, Line 60: Delete "an" and insert -- $a_n$ --, therefor.

Column 11, Line 63: Delete "an" and insert -- $a_n$ --, therefor.

Column 12, Line 8: Delete "an" and insert -- $a_n$ --, therefor.

Column 12, Line 13: Delete "an" and insert -- $a_n$ --, therefor.

Column 12, Line 15: Delete "an" and insert -- $a_n$ --, therefor.

Column 12, Line 19: Delete "an" and insert -- $a_n$ --, therefor.

Signed and Sealed this
Twenty-ninth Day of May, 2018

Andrei Iancu
*Director of the United States Patent and Trademark Office*

CERTIFICATE OF CORRECTION (continued)
U.S. Pat. No. 9,927,714 B2

Column 12, Line 22 (approx.): Delete "an" and insert -- $a_n$ --, therefor.

Column 12, Line 25: Delete "an" and insert -- $a_n$ --, therefor.

Column 12, Line 26: Delete "an" and insert -- $a_n$ --, therefor.

Column 12, Line 29: Delete "an" and insert -- $a_n$ --, therefor.

Column 13, Line 46 (approx.): Delete "$x_i$" and insert -- $x_1$ --, therefor.

Column 14, Line 8 (Claim 1): After "apparatus" insert -- is --.